US012585192B2

(12) United States Patent　　　　　(10) Patent No.:　US 12,585,192 B2
Chang et al.　　　　　　　　　　　　　(45) Date of Patent:　　Mar. 24, 2026

(54) IMPRINT METHOD FOR FABRICATION OF LOW DENSITY NANOPORE MEMBRANE

(71) Applicant: Seagate Technology LLC, Fremont, CA (US)

(72) Inventors: Thomas Chang, Menlo Park, CA (US); Kim Yang Lee, Fremont, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 732 days.

(21) Appl. No.: 18/062,225

(22) Filed: Dec. 6, 2022

(65) Prior Publication Data

US 2023/0194991 A1　　Jun. 22, 2023

Related U.S. Application Data

(60) Provisional application No. 63/292,711, filed on Dec. 22, 2021.

(51) Int. Cl.
　　*G03F 7/20*　　　　　(2006.01)
　　*B82Y 40/00*　　　　 (2011.01)
(52) U.S. Cl.
　　CPC .............. *G03F 7/2016* (2013.01); *G03F 7/20* (2013.01); *G03F 7/2004* (2013.01); *B82Y 40/00* (2013.01)
(58) Field of Classification Search
　　CPC ........ G03F 7/0002; G03F 7/20; G03F 7/2004; B82Y 40/00
　　See application file for complete search history.

(56) References Cited

U.S. PATENT DOCUMENTS

| 9,460,747 B2 | 10/2016 | Xu et al. | |
| 9,626,996 B2 | 4/2017 | Yang et al. | |
| 9,773,520 B2 | 9/2017 | Yang et al. | |
| 2005/0218112 A1* | 10/2005 | Marty | G03F 7/0002 |
| | | | 216/41 |
| 2009/0305173 A1 | 12/2009 | Xiao et al. | |
| 2010/0086877 A1* | 4/2010 | Soma | G03F 1/34 |
| | | | 430/323 |
| 2011/0024950 A1 | 2/2011 | Kruglick | |
| 2016/0140991 A1* | 5/2016 | Chen | G11B 5/746 |
| | | | 428/840 |
| 2021/0082800 A1 | 3/2021 | Schenker et al. | |
| 2021/0318288 A1* | 10/2021 | Drndic | G01N 27/44791 |

* cited by examiner

*Primary Examiner* — Brittany L Raymond

(74) *Attorney, Agent, or Firm* — SEAGATE TECHOLOGY LLC

(57) ABSTRACT

A method of manufacturing a synthetic nanopore device for DNA sequencing disclosed herein includes providing a base template, forming a guiding layer on top of the base template, and forming a photoresist layer on top of the guiding layer. The photoresist layer is patterned, and the guiding layer is etched for form a guiding pattern. The photoresist layer is removed to form a guiding template and a self-assembled monolayer is deposited on at least a portion of the guiding template to form a patterned template. The patterned template is exposed to one or more etch processes to form a nanoimprint lithography template. A membrane is imprinted with the nanoimprint lithography template to form an array of nanopores in the membrane.

20 Claims, 11 Drawing Sheets

IMPRINT METHOD FOR FABRICATION OF LOW DENSITY NANOPORE MEMBRANE

CROSS-REFERENCE TO RELATED APPLICATIONS

This application claims priority to U.S. Provisional Patent Application Ser. No. 63/292,711, entitled "IMPRINT METHOD FOR FABRICATION OF LOW DENSITY NANOPORE MEMBRANE" and filed Dec. 22, 2021, the entire contents of which are hereby incorporated by reference.

BACKGROUND

There is always a desire for more data storage and increased writing to and reading from that storage. DNA is an emerging technology that has the potential to substantially increase volumetric data density for data storage compared to other storage methods. Current methods maintain that a DNA strand or gene, to store 5 KB of data, can be written in 14 days. Comparatively, magnetic disk drives and magnetic tapes can write 1 Terabyte in about an hour. A single DNA base pair location can store 2 bits; thus 4 Tera-base pairs would need to be stored in an hour to match the capabilities of a single disk drive or tape. Although current technology is believed to be capable of writing 15 base pairs an hour, there needs to be an 8 to 9 order of magnitude improvement in writing speed for DNA storage to be viable. Various methods have been proposed over the past decade that would allow individual DNA strands to be read directly. Among these, nanopore and nanochannel based approaches have emerged as the most promising. However, many challenges exist related to fabricating a channel and/or pore opening that is accurately placed and is sufficiently small to limit passage of a single DNA strand.

SUMMARY

The present disclosure describes an imprint method for the fabrication of synthetic nanopores across a large membrane surface for use in DNA storage or as a DNA sequencer. The method includes the use of e-beam lithography and guided self-assembly to fabricate a nanoimprint template. Block-copolymers (BCP) or gold nanoparticles may be used in the self-assembly process. With this combination of techniques, very small (e.g., less than 2 nm) features may be patterned at customized locations across a large membrane surface. Block-copolymers (BCP) or gold nanoparticles may be used in the self-assembly process.

In one example, a method of manufacturing a synthetic nanopore device for DNA sequencing is described. The method comprises the steps of providing a base template and forming a guiding layer on top of the base template. A photoresist layer may be formed on top of the guiding layer and may be patterned and etched to form a guiding pattern. The photoresist layer may be removed to form a guiding template. Deposition of a self-assembled monolayer on at least a portion of the guiding template may occur after the patterning step to form a patterned template. Thereafter, the patterned template may be exposed to one or more etch processes to form a nanoimprint lithography template. The resulting nanoimprint lithography template may be used to imprint a membrane to form an array of nanopores in the membrane.

These and other features and aspects of various examples may be understood in view of the following detailed discussion and accompanying drawings.

DETAILED DESCRIPTION

Figure 1:
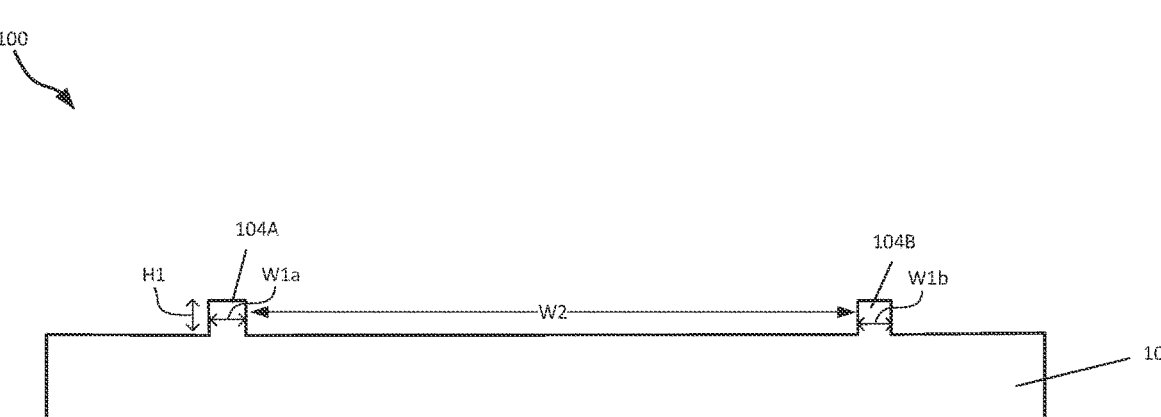
FIG. 1 is a cross-sectional view of a patterned nanoimprint lithography template, according to various aspects of the present disclosure.

FIG. 1 is a cross-sectional view of a patterned nanoimprint lithography template, according to various aspects of the present disclosure. Nanoimprint lithography template 100 includes base template 102. In the example of FIG. 1, base template 102 may be formed from a combination of materials including but not limited to quartz, Si, Cr or a combination thereof. In the example of FIG. 1, base template 102 is a single-level template and includes a plurality of nanoimprint features 104A and 104B (collectively, nanoimprint features 104). In a single-level template, each of nanoimprint features 104 are defined by a single height and width. That is, as shown in the example of FIG. 1, the height of nanoimprint features 104 may be described by a single dimension, e.g., H1. In other words, in a single-level template, each nanoimprint feature 104A, 104B of nanoimprint features 104 is substantially the same height H1 (e.g., within manufacturing tolerances) across the entire width of the respective nanoimprint feature. Said yet another way, in a single-level template, nanoimprint feature 104A may be substantially the same height across the width of nanoimprint feature 104A, while nanoimprint feature 104B may be substantially the same height across the width of nanoimprint feature 104B (though the height and/or width of nanoimprint feature 104A may be the same or different than the height and/or width of nanoimprint feature 104B).

Nanoimprint features 104A and 104B are defined by widths W1$a$ and W1$b$, respectively. Widths W1$a$ and W1$b$ (collectively, widths W1) may be equal to one another or may be different (e.g., wider or narrower). In some examples, widths W1 are approximately 2 nm. Nanoimprint features 104 are separated by distance W2. In one example, distance W2 is larger than width W1$a$ and/or W1$b$. For example, distance W2 may be approximately 1 nm to approximately 5 nm. In some examples, distance W2 may be at least 10 times larger than widths W1.

Figure 2A:
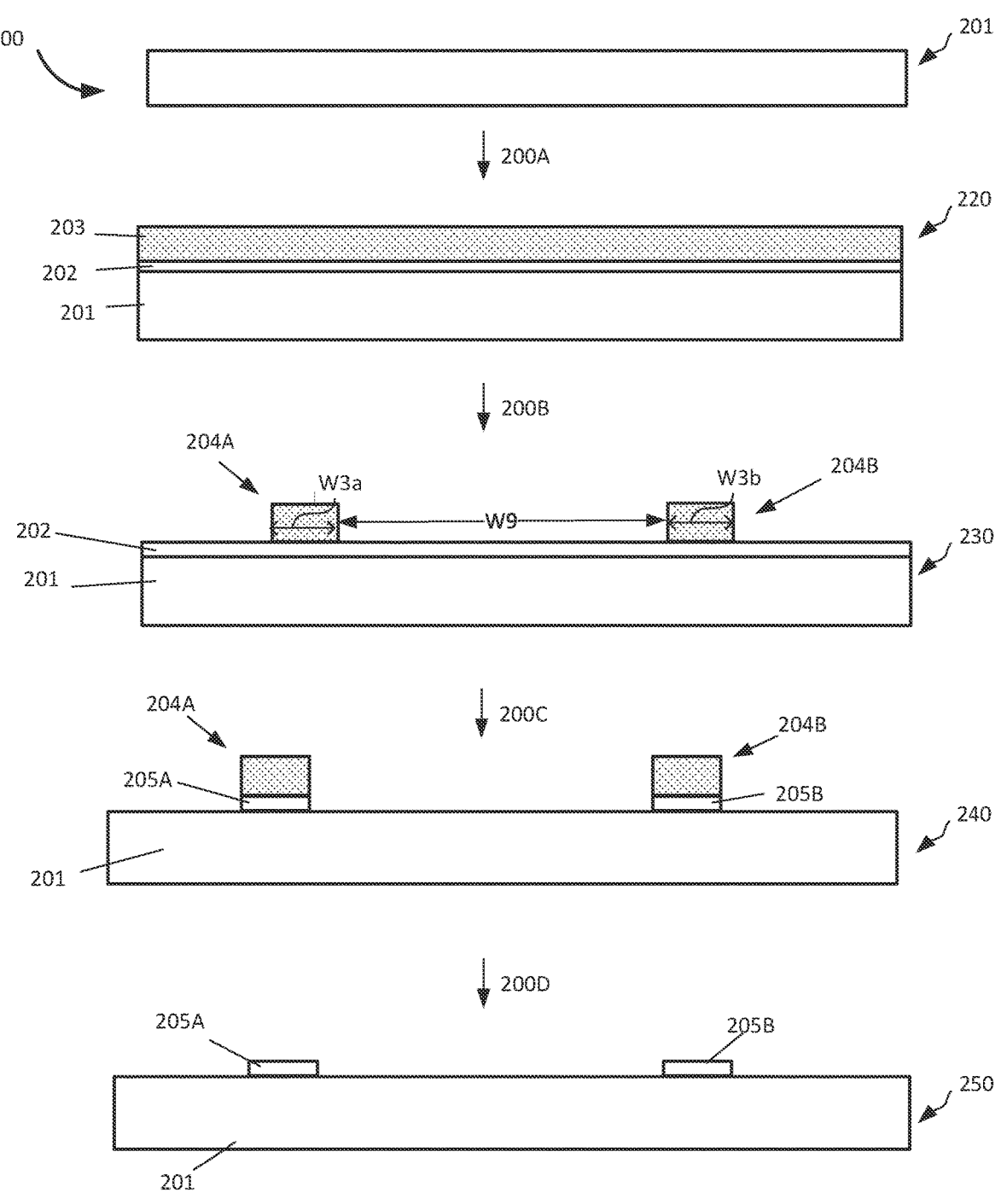
FIG. 2A is a process flow diagram showing multiple cross-sectional views of a method of forming a nanoimprint lithography template, according to various aspects of the present disclosure.
Figure 2B:
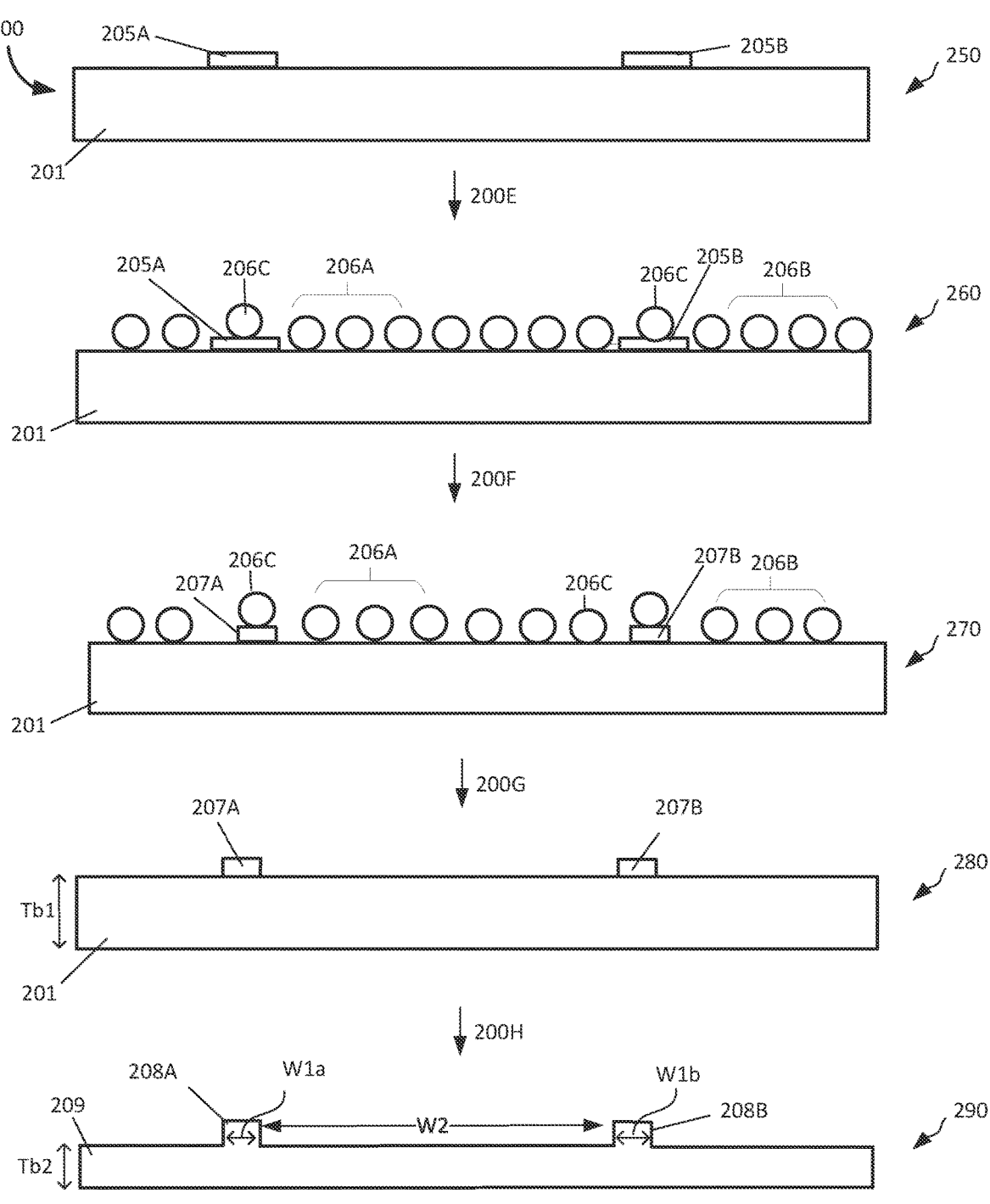
FIG. 2B is a process flow diagram showing multiple cross-sectional views of a method of forming a nanoimprint lithography template, according to various aspects of the present disclosure.

FIG. 2A and FIG. 2B are process flow diagrams showing multiple cross-sectional views of a method of forming a nanoimprint lithography template (e.g., nanoimprint lithography template 100 of FIG. 1), according to various aspects of the present disclosure. In the example of FIG. 2A, the method includes process flow 200 and provides base template 201. Base template 201 may be formed from a combination of materials including but not limited to quartz, Si, Cr or a combination thereof.

Structure 220 is formed in step 200A. Structure 220 includes base template 201, guiding layer 202 and photoresist layer 203. In step 200A, guiding layer 202 is formed on top of base template 201. Guiding layer 202 may include a single-layer guiding layer using materials such as SiO$_2$, chromium (Cr) or amorphous carbon (a-C). In the deposition of guiding layer 202, various deposition techniques may be utilized. Examples of illustrative deposition methods may include vapor deposition techniques such as chemical vapor deposition (CVD), physical vapor deposition (PVD), including DC and RF magnetron sputtering, cathodic arc deposition, plasma enhanced chemical vapor deposition (PECVD), and laser ablation. In some examples, guiding layer 202 has a thickness ranging from about 1 nm to about 5 nm. Also, in step 200A, photoresist layer 203 is formed on top of guiding layer 202. The photoresist in photoresist layer 203 can include any photoresist used in modern lithography methods. The purpose of photoresist layer 203 is to mask or protect regions during etch process steps which will remove material that is left unprotected.

After the deposition of guiding layer 202 and photoresist layer 203, photoresist layer 203 is patterned in step 200B, as illustrated by structure 230. Photoresist layer 203 is provided to protect the masked portion of guiding layer 202 from the removal process that occurs during future etch process steps. In the example of structure 230, photoresist layer 203 is shown after patterning to form photoresist features 204A and 204B (collectively, photoresist features 204) of widths W3$a$ and W3$b$ (collectively, widths W3). Width W3$a$ may be equal to width W3$b$ or may be different (e.g., wider or narrower) than width W3$b$. In some examples, widths W3 are approximately 2 nm. Photoresist features 204 are separated by distance W9. In one example, distance W9 is larger than width W3$a$ and/or W3$b$. For example, distance W9 may be between about 100 nm and about 1000 nm. In some examples, distance W9 may be at least 10 times larger than widths W3.

Photoresist features 204 may be formed by a variety of known techniques. In some examples, photoresist features 204 may be formed using a lithography technique. Examples of lithography techniques include optical lithography, such as deep ultraviolet (DUV) lithography, which uses light to transfer a pattern from photomask to light-sensitive photoresist. Other examples of lithography techniques include nanoimprint lithography (NIL), immersion lithography and e-beam lithography.

In step 200C, structure 230 is exposed to an etching process. During etch process step 200C, any portion of guiding layer (e.g., guiding layer 202 in structure 230) not covered by photoresist features 204 is removed and a pattern is formed in guiding layer 202. Following etch process step 200C, structure 240 illustrates a guiding pattern and includes photoresist features 204 and guiding features 205A and 205B (collectively, guiding features 205). Guiding layer 202 may be etched using either reactive ion etching (RIE), sputter etching, ion-beam etching, plasma etching or inductively coupled plasma (ICP) etching. In some examples etch process step 200C may be a selective etch process. In one example, guiding layer 202 is etched by RIE using fluorinated chemistry, such as CHF6, CHF3 or CF4.

In step 200D, structure 240 is exposed to an etch process. During etch process step 200D, photoresist features 204 are removed, resulting in formation of a guiding template 250. Guiding template 250 includes guiding features 205 which may be used to guide self-assembly of self-assembling materials into a high-density or into a low-density homogenous pattern. Photoresist features 204 may be etched using either reactive ion etching (RIE), sputter etching, ion-beam etching, plasma etching or inductively coupled plasma (ICP) etching. In some examples, etch process step 200D is a selective etch process.

In the example of FIG. 2B, the method includes a continuation of process flow 200 and provides guiding template 250. A self-assembled monolayer is deposited onto a least a portion of guiding template 250 in step 200E. As used in this description, self-assembly means the formation of periodic nanostructures of self-assembling materials. Examples of self-assembling materials include but are not limited to block copolymers, nanowires, nanoparticles (e.g., gold nanoparticles), and liquid crystal materials.

Patterned template 260 is formed via self-assembly of nanostructures e.g., nanostructures 206A, 206B and 206C (collectively, nanostructures 206) on top of guiding template 250. The position and/or orientation of nanostructures 206A and 206B is guided by guiding features 205. Nanostructures 206A and 206B may self-organize between guiding features 205. In some examples, one or more nanostructure may attach to guiding features 205. In the example of patterned template 260, nanostructures 206C attach to guiding features 205. Nanostructures 206C may mask regions of guiding features 205 during an etch process, for example etch process step 200F.

Etch process step 200F etches guiding features 205 to provide etched guiding features 207A and 207B (collectively, etched guiding features 207) as illustrated in structure 270. The widths of etched guiding features 207 may be less than the width of guiding features 205. Etch process step 200F may be a selective etch step. That is, etch process step 200F may etch guiding feature 205 but does not etch nanostructures 206 or base template 201. RIE is typically the etch method of choice for the selective etch process.

In step 200G, nanostructures 206 are removed from structure 270 resulting in formation of structure 280. Removal of nanostructures 206 from structure 270 can be achieved via a selective wet etch process. Structure 280 includes base template 201 and etched guiding features 207. Etched guiding features 207 may act as a mask for etching of base template 201. The thickness of base template 201 in structure 270 is represented by dimension Tb1.

Step 200H represents an etch process step where base template 201 is etched. In etch process step 200H, etched guiding features 207 protect those areas of base template 201 directly below the etched guiding features 207 from the etch process. Base template 201 may be etched using many possible methods including isotropic or directional etch methods.

Those areas of base template 201 exposed to the etch process are etched and the thickness of etched base template 209 is represented by dimension Tb2 in nanoimprint lithography template 290. Following etch process step 200H, dimension Tb2 is typically less than dimension Tb1. Nanoimprint lithography template 290 is an example of a nanoimprint lithography template 100 of FIG. 1. Nanoimprint lithography template 290 includes etched base template 209 and nanoimprint features 208A and 208B (collectively nanoimprint features 208) defined by widths W1*a* and W1*b* (collectively, widths W1). Width W1*a* may be equal to width W1*b* or may be different (e.g., wider or narrower) than width W1*b*. In some examples, widths W1 are approximately 2 nm. Nanoimprint features 208 are separated by distance W2. In one example, distance W2 is larger than width w1*a* and/or w1*b*. For example, distance W2 may be between approximately 100 nm and approximately 1000 nm. In some examples, distance W2 may be up to 10 times larger than widths W1.

Figure 3A:
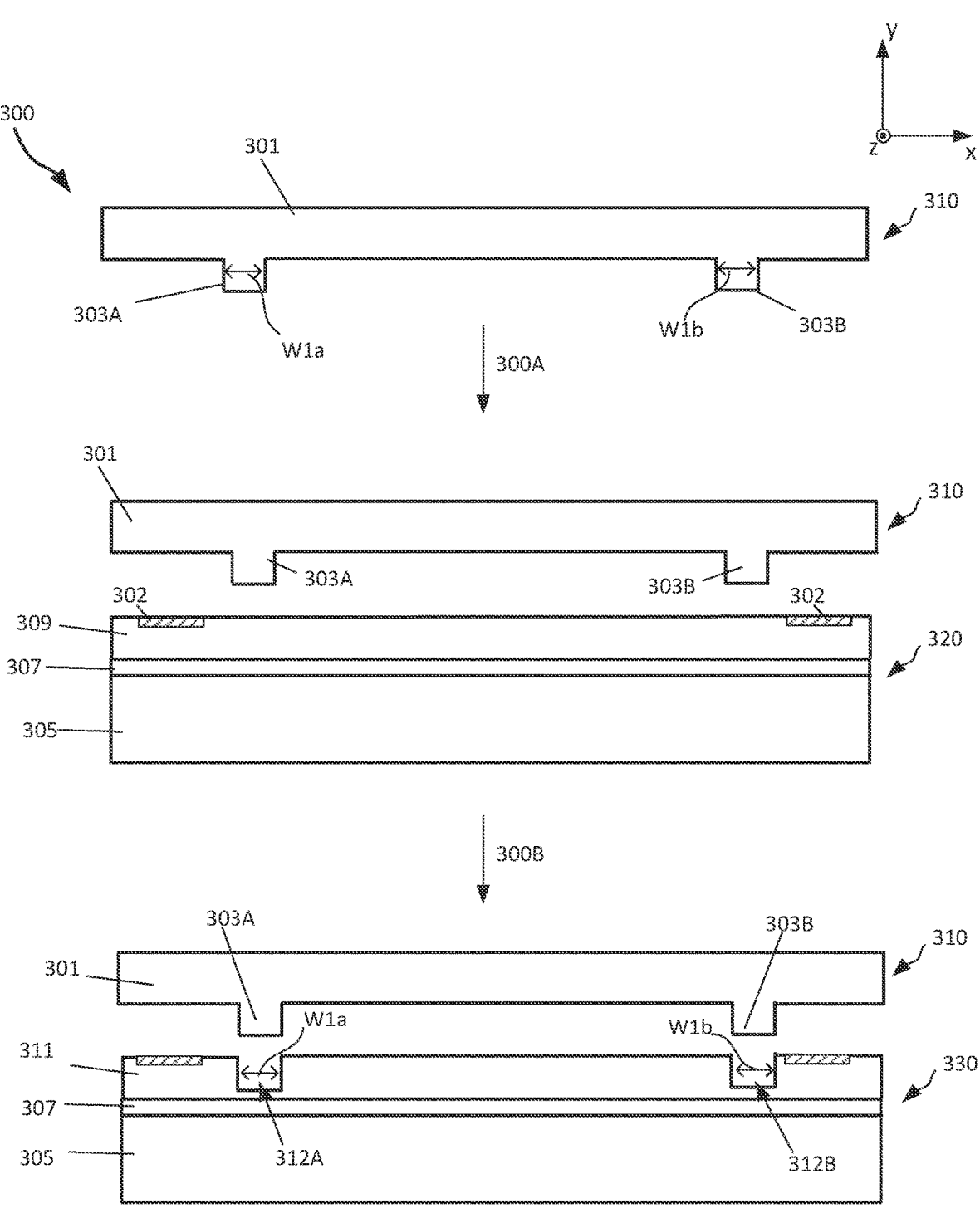
FIG. 3A is a process flow diagram showing multiple cross-sectional views of a method of forming a synthetic nanopore device, according to various aspects of the present disclosure.
Figure 3B:
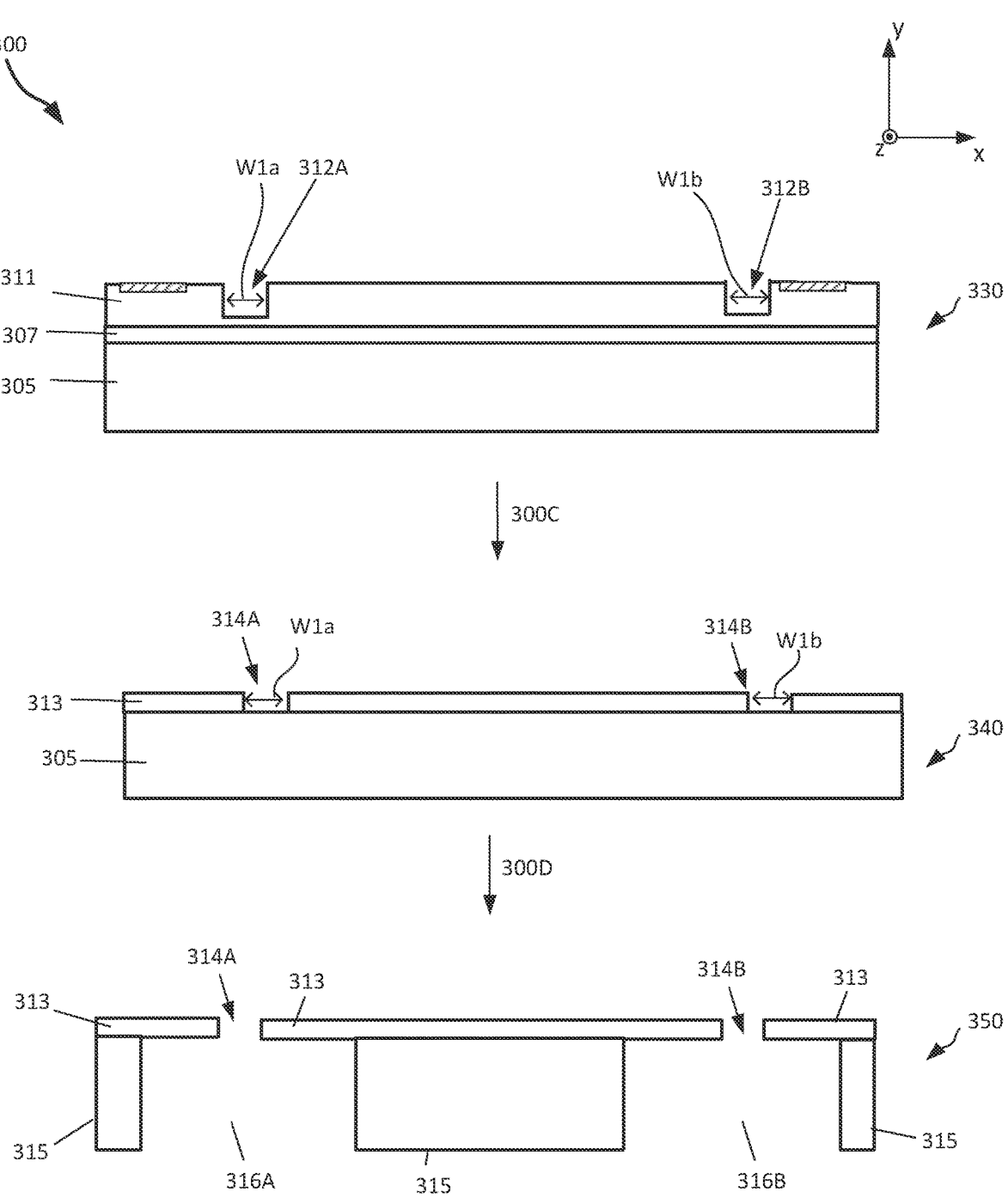
FIG. 3B is a process flow diagram showing multiple cross-sectional views of a method of forming a synthetic nanopore device, according to various aspects of the present disclosure.

FIGS. 3A and 3B are process flow diagrams showing multiple cross-sectional views of a method of forming a synthetic nanopore device, according to various aspects of the present disclosure. The method includes process flow 300 and provides nanoimprint lithography template 310. Nanoimprint lithography template 310 is an example of nanoimprint lithography template 290 of FIG. 2. Nanoimprint lithography template 310 includes base template 301 and nanoimprint features 303A and 303B (collectively, nanoimprint features 303). Nanoimprint features 303A and 303B with widths W1*a* and W1*b*, respectively, may be reproduced onto structure 320. In other words, each of the nanoimprint features 303 has particular dimensions that correspond to the dimensions of a feature to be reproduced onto structure 320.

Structure 320 is an example substrate 305 with nanoimprint membrane 307 and imprint resist layer 309. Alignment marks 302 may be provided in imprint resist layer 309. Substrate 305 may, for example, be a glass disc, an aluminum disc, an AlTiC disc, or a silicon wafer, among others. Substrate 305 may have any number and type of layers already deposited thereon. Substrate 305 may have been patterned with any different lithographic or patterning process. In the example of structure 320, nanoimprint membrane 307 is deposited on top of substrate 305. Nanoimprint membrane 307 may be formed from a thin layer of dielectric or semiconductive material in the thickness range of about 1 nm to about 10 nm. Examples of dielectric or semiconductive material include SiN, SiC or Carbon. Imprint resist layer 309 is deposited on top of nanoimprint membrane 307.

In step 300A, nanoimprint lithography template 310 may be aligned with structure 320 via alignment marks 302 and lowered toward structure 320 (e.g., in the negative y-direction).

Structure 330 is formed in step 300B by bringing nanoimprint lithography template 310 into close proximity to substrate 305 with imprint resist layer 309 and nanoimprint membrane 307. Nanoimprint lithography template 310 is brought into close proximity to substrate 305 without actually touching substrate 305 or nanoimprint membrane 307. Imprint resist layer 309 may conform with the topographic pattern and nanoimprint features 303 upon contact with nanoimprint lithography template 310, thereby forming patterned resist layer 311. Various curing methods may be deployed in order to solidify imprint resist layer 309 into the shape of nanoimprint lithography template 310.

Structure 330 illustrates nanoimprint membrane 307 and imprinted features 312A and 312B (collectively, imprinted features 312) in patterned resist layer 311. Imprinted features 312A and 312B may have widths W1*a* and W1*b*, respectively. Additional processing steps may now be performed to create the desired synthetic nanopore devices.

In FIG. 3B, during step 300C, structure 330 is exposed to an etch process to form structure 340. During etch process step 300C, in regions of imprinted features 312, portions of nanoimprint membrane 307 may be removed resulting in etched nanoimprint membrane 313 and nanopores 314A and 314B (collectively, nanopores 314). Nanopores 314A and 314B have widths W1*a* and W1*b* which are substantially equal to the widths of imprinted features 312A and 312B. Nanoimprint membrane 307 may be etched using either reactive ion etching (RIE), plasma etching or inductively coupled plasma (ICP) etching. In one example, nanoimprint membrane 307 is etched by RIE using fluorinated chemistry, such as CHF6, CHF3 or CF4. In other examples, a selective etch process may be used to etch nanoimprint membrane 307.

In step 300D, etched substrate 315 is formed by performing a backside etch of substrate 305 to generate cavities 316A and 316B. Substrate 305 may be etched using either reactive ion etching (RIE), plasma etching or inductively coupled plasma (ICP) etching. In one example, nanoimprint membrane 307 is etched by RIE using fluorinated chemistry, such as CHF6, CHF3 or CF4. In other examples, a selective etch process may be used to etch substrate 305.

While structure 350 is illustrative of a structure with two nanopores, 314A and 314B and two cavities 316A and 316B, process flow 300 may be extended over a larger area (e.g., extending in the x-z plane in FIG. 3) to produce an array of nanopores with any number of nanopores and cavities and with any distance between each nanopore and cavity in the array. Direct-write lithography methods (e.g., e-beam lithography) at the photoresist patterning step (e.g., step 200B) also provide the ability to create very small (<10 nm) structures in custom locations.

Figure 4:
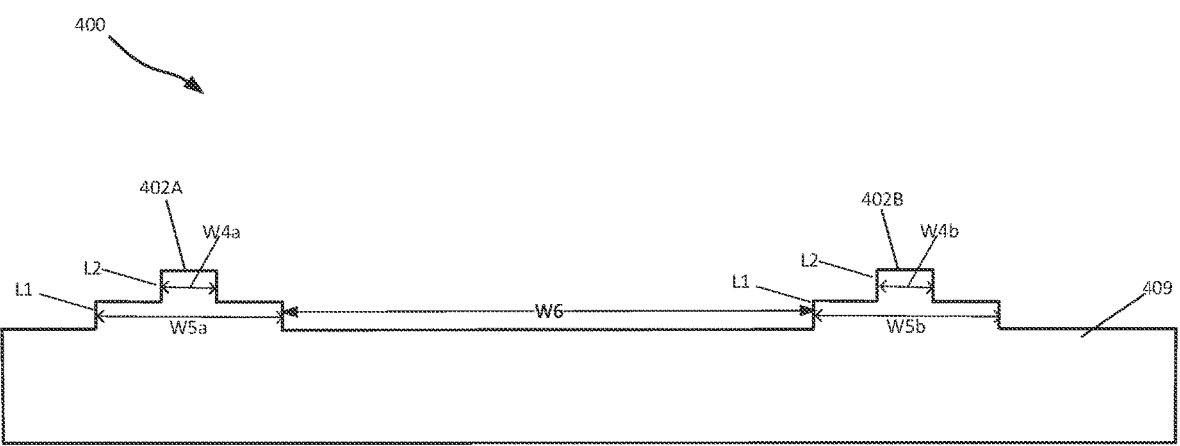
FIG. 4 is a cross-sectional view of a patterned nanoimprint lithography template according to various aspects of the present disclosure.

FIG. 4 illustrates an example patterned nanoimprint lithography template. Nanoimprint lithography template 400 includes base template 409. In the example of FIG. 4, base template 409 may be formed from a combination of materials including but not limited to quartz, Si, Cr or a combination thereof.

In one example, nanoimprint lithography template 400 is a multi-level template that includes nanoimprint features 402A and 402B (collectively, nanoimprint features 402) that are each more than one level. In a multi-level template, each of nanoimprint features 402 includes a plurality of levels that are defined by different widths. In the example of FIG. 4, nanoimprint lithography template 400 represents a dual-level template such that nanoimprint feature 402A includes levels L1 and L2 and nanoimprint feature 402B includes levels L1 and L2. In the example of FIG. 4, nanoimprint features 402 have widths W4*a*, W4*b* (collectively, widths W4), W5*a* and W5*b* (collectively, widths W5). Width W4*a* may be equal to width W4*b* or may be different (e.g., wider or narrower) than width W4*b*. In some examples W4*a* is between about 0.5 nm and about 1.5 nm nm. Width W5*a* may be equal to width W5*b* or may be different (e.g., wider or narrower) than width W5*b*. In some examples W5*a* is between about 1.5 nm and about 4.5 nm. In some examples, width W4*a* may be equal to width W5*a* or may be different (e.g. wider or narrower) than width W5*a*. Nanoimprint features 402 are separated by distance W6. In one example, distance W6 is larger than widths W4 and/or W5. For example, width W6 may be between about 100 nm and about 1000 nm.

In some examples, the height of each level of nanoimprint features 402 may be the same as every other level of nanoimprint features 402. In one example, the height of one level (e.g., L1) may be different that the height of another level (e.g., L2). In some examples, the heights of a layer (e.g., L1) of nanoimprint feature 402A may be different or equal to the height of a corresponding layer (e.g., L1) of a different nanoimprint feature 402B.

Figure 5A:
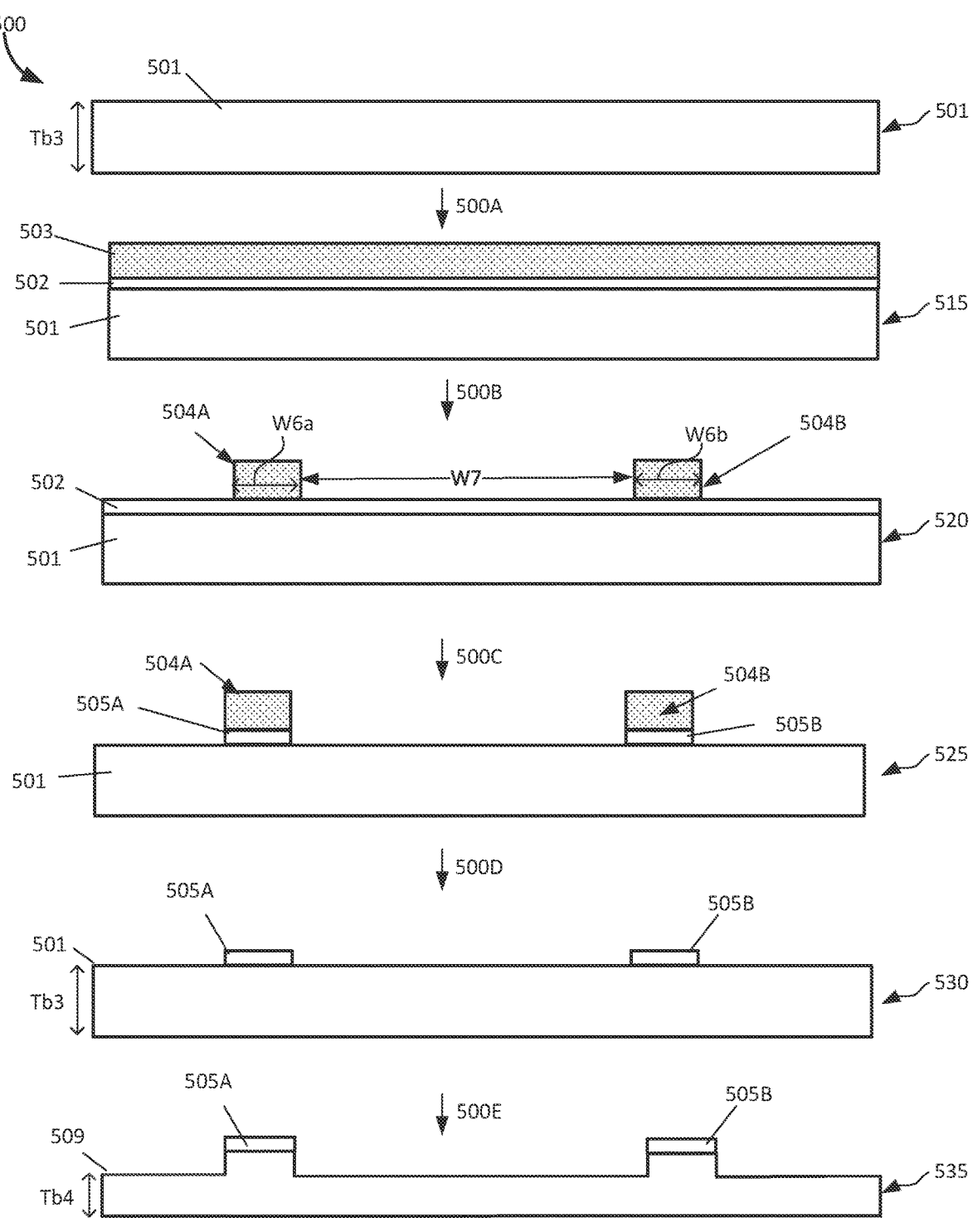
FIG. 5A is a process flow diagram showing multiple cross-sectional views of a method of forming a nanoimprint lithography template, according to various aspects of the present disclosure.
Figure 5B:
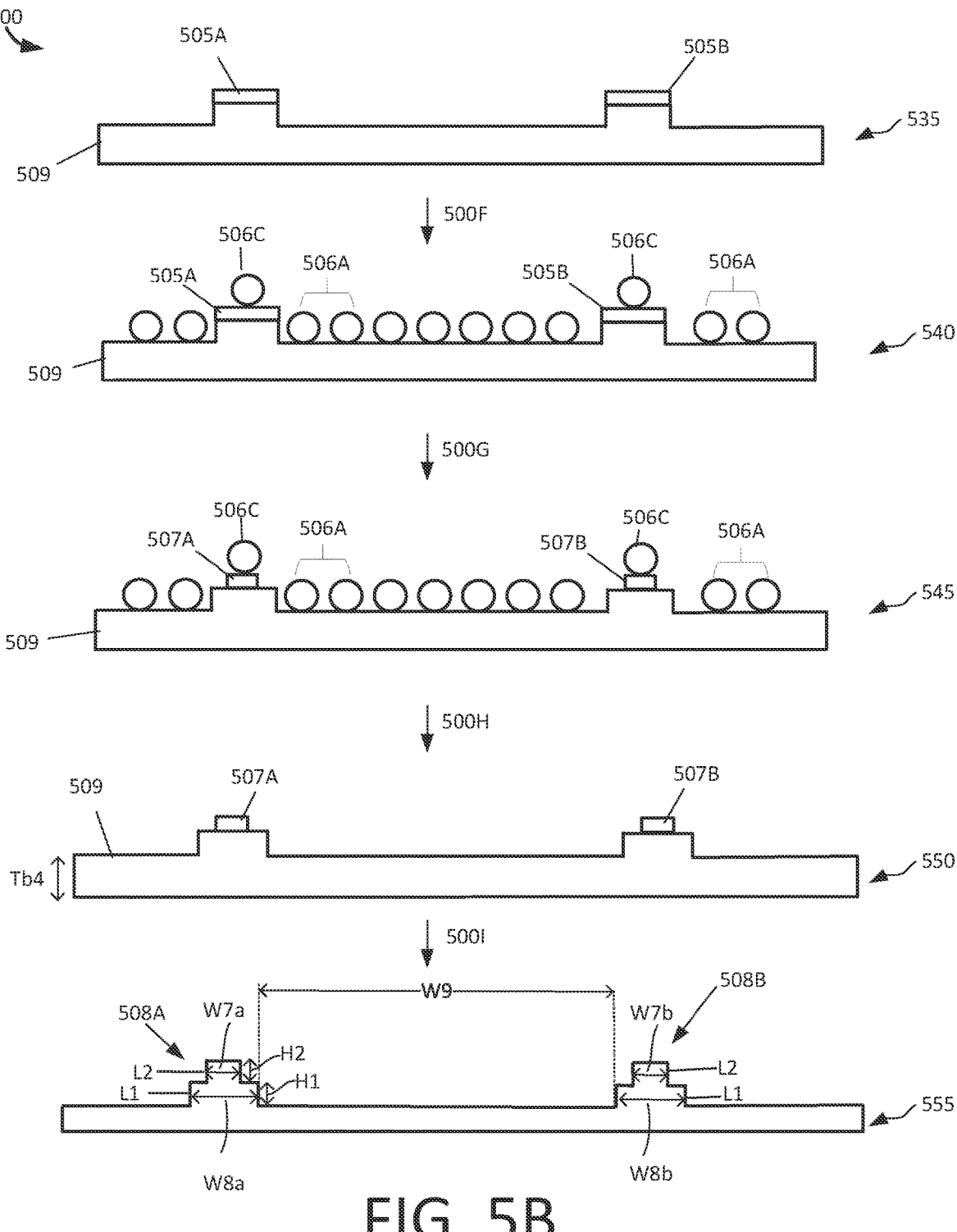
FIG. 5B is a process flow diagram showing multiple cross-sectional views of a method of forming a nanoimprint lithography template, according to various aspects of the present disclosure.

FIGS. 5A and 5B are process flow diagrams showing multiple cross-sectional views of a method of forming a nanoimprint lithography template (e.g., nanoimprint lithography template 400 of FIG. 4), according to various aspects of the present disclosure. In the example of FIGS. 5A and 5B, process flow diagrams illustrate the formation of a multi-level nanoimprint lithography template. In the example of FIG. 5A, the method includes process flow 500 and provides base template 501. Base template 501 may be formed from a combination of materials including but not limited to quartz, Si, Cr or a combination thereof. The thickness of base template 501 is represented by dimension Tb3.

Structure 515 is formed in step 500A. Structure 515 includes base template 501, guiding layer 502 and photoresist layer 503. As illustrated in step 500A, guiding layer 502 is formed on top of base template 501. Guiding layer 502 may include a single-layer guiding layer using materials such as chromium (Cr), metal nitride, metal oxide, metal alloy, or amorphous carbon (a-C). In the deposition of guiding layer 502, various deposition techniques may be utilized. Examples of illustrative deposition methods may include vapor deposition techniques such as chemical vapor deposition (CVD), physical vapor deposition (PVD), including magnetron sputtering, cathodic arc deposition, plasma enhanced chemical vapor deposition (PECVD), and laser ablation. In some examples, guiding layer 502 has a thickness ranging from about 1 nm to about 10 nm. Also, in step 500A, photoresist layer 503 is formed on top of guiding layer 502. The photoresist in photoresist layer 503 can include any photoresist material. The purpose of photoresist layer 503 is to mask or protect regions during etch process steps which will remove material that is left unprotected.

Structure 520 is created in step 500B by patterning photoresist layer 503 after the deposition of guiding layer 502 and photoresist layer 503. Photoresist layer 503 is provided to protect the masked portion of guiding layer 502 from the removal process that occurs during future etch process steps. In the example of structure 520, photoresist layer 503 is shown after patterning to form photoresist features 504A and 504B (collectively, photoresist features 504) of widths W6*a* and W6*b* (collectively, widths W6). Width W6*a* may be equal to width W6*b* or may be different (e.g., wider or narrower) than width W6*b*. In some examples, widths W6 are approximately 2 nm. Photoresist features 504 are separated by distance W7. In one example, distance W7 is larger than width W6*a* and/or W6*b*. For example, distance W7 may be between about 100 nm and about 1000 nm. In some examples, distance W7 may be up to 10 times larger than widths W6.

Photoresist features 504 may be formed by a variety of known techniques. In some examples, photoresist features 504 may be formed using a lithography technique. Examples of lithography techniques include optical lithography, such as deep ultraviolet (DUV) lithography, which uses light to transfer a pattern from photomask to light-sensitive photoresist. Other examples of lithography techniques include nanoimprint lithography (NIL), immersion lithography and e-beam lithography.

In step 500C, structure 520 is exposed to an etching process. During etch process step 500C, any portion of guiding layer (e.g., guiding layer 502 in structure 520) not covered by photoresist features 504 is removed and a pattern is formed in guiding layer 502. Following etch process step 500C, structure 525 illustrates a guiding pattern and includes photoresist features 504 and guiding features 505A and 505B (collectively, guiding features 505). Guiding features 505 may have similar widths to photoresist features 504. Guiding layer 502 may be etched using either reactive ion etching (RIE), plasma etching or inductively coupled plasma (ICP) etching. In one example, guiding layer 502 is etched by RIE using fluorinated chemistry, such as CHF6, CHF3 or CF4. In some examples, etch process step 500C may be a selective etch process.

In step 500D, structure 530 is formed by removing photoresist features 504. Structure 530 includes guiding features 505 which may be used to guide self-assembly of self-assembling materials into a high-density or into a low-density homogenous pattern. Photoresist features 504 may be etched using either reactive ion etching (RIE), sputter etching, ion-beam etching, plasma etching or inductively coupled plasma (ICP) etching. In some examples, etch process step 500D is a directional etch process.

In step 500E, structure 530 is exposed to an etching process. During etch process step 500E, any portion of base template 501 not covered by guiding features 505 is etched, resulting in etched base template 509 and guiding template 535. Those areas of base template 501 exposed to the etch process are etched and the thickness of etched base template 509 is represented by dimension Tb4 in guiding template 535. Following etch process step 500E, dimension Tb4 is typically less than dimension Tb3. Base template 501 may be etched using either reactive ion etching (RIE), plasma etching or inductively coupled plasma (ICP) etching. In one example, base template 501 is etched by RIE using fluorinated chemistry, such as CHF6, CHF3 or CF4.

In the example of FIG. 5B, the method includes a continuation of process flow 500 and provides guiding template 535 which includes etched base template 509 and guiding features 505.

A self-assembled monolayer is deposited onto a least a portion of guiding template 535 in step 500F. As used in this description, self-assembly means the formation of periodic nanostructures of self-assembling materials. Examples of self-assembling materials include but are not limited to block copolymers, and nanoparticles (e.g., gold nanoparticles). In some examples, gold nanoparticles may be functionalized with a monolayer of ligand which allows for more effective manipulation of the gold nanoparticles.

Patterned template 540 is formed via self-assembly of nanostructures e.g., nanostructures 506A, 506B and 506C (collectively, nanostructures 506) on top of guiding template 535. The position and/or orientation of nanostructures 506A and 506B is guided by guiding features 505. Nanostructures 506A and 506B may self-organize between guiding features 505. In some examples, one or more nanostructure may attach to guiding features 505. In the example of patterned template 540, nanostructures 506C attach to guiding features 505. Nanostructures 506C may mask regions of guiding features 505.

Etch process step 500G etches guiding features 505 using a selective etch process that trims guiding features 505, resulting in etched guiding features 507A and 507B (collectively, etched guiding features 507) as illustrated in structure 545. The widths of etched guiding features 507 may be less than the width of guiding features 505. Guiding features 505 may be etched using either reactive ion etching (RIE), plasma etching or inductively coupled plasma (ICP) etching. In one example, guiding features 505 are etched by RIE using fluorinated chemistry, such as CHF6, CHF3 or CF4.

In step 500H, nanostructures 506 are removed from structure 545 resulting in formation of structure 550. Nanostructures 506 may be removed from structure 545 via a wet, selective etch process. Structure 550 includes etched base template 509 and etched guiding features 507. Etched guiding features 507 may act as a mask for further etching of etched base template 509.

Step 500I represents an etch process step where structure 550 is exposed to an etch process. In etch process 500I, any region not protected by etched guiding features 507 will be etched. In etch process 500I, etched guiding features 507 protect those areas of etched base template 509 directly below etched guiding features 507 from the etch process. In etch process 500I, etched base template 509 may be etched using a directional selective etch process step which may include a grazing angle etch.

Those areas of etched base template 509 exposed to the etch process are etched, resulting in formation of nanoimprint features 508A and 508B (collectively, nanoimprint features 508) with heights H2 and H3, as illustrated in nanoimprint lithography template 555.

In the example of nanoimprint lithography template 555, nanoimprint features 508 include two levels with each level having a height. In some examples, the height of each level of nanoimprint features 508 may be the same as every other level of nanoimprint features 508. In one example, the height (e.g., H1) of one level (e.g., L1) may be different that the height (e.g. H2) of another level (e.g., L2). In some examples, the heights of a layer (e.g., L1) of nanoimprint feature 508A may be different or equal to the height of a corresponding layer (e.g., L1) of a different nanoimprint feature 508B.

In the example of nanoimprint lithography template 555, nanoimprint features 508 have widths W7a, W7b (collectively, widths W7), and W8a, W8b (collectively, widths W8). Width W7a may be equal to width W7b or may be different (e.g., wider or narrower) than width W7b. In some examples W7a is approximately between about 0.5 nm and about 1.5 nm. In some examples, width W8a may be equal to width W8b or may be different (e.g. wider or narrower) than width W8b. Width W8a is approximately between about 1.5 nm and about 4.5 nm. In some examples, width W7a may be equal to width W8a or may be different (e.g. wider or narrower) than width W8a. In some examples, width W7b may be equal to width W8b or may be different (e.g. wider or narrower) than width W8b. Nanoimprint features 508 are separated by distance W9. In one example, distance W9 is larger than widths W7 and/or W8. For example, width W9 may be between about 100 nm and about 1000 nm.

Figure 6A:
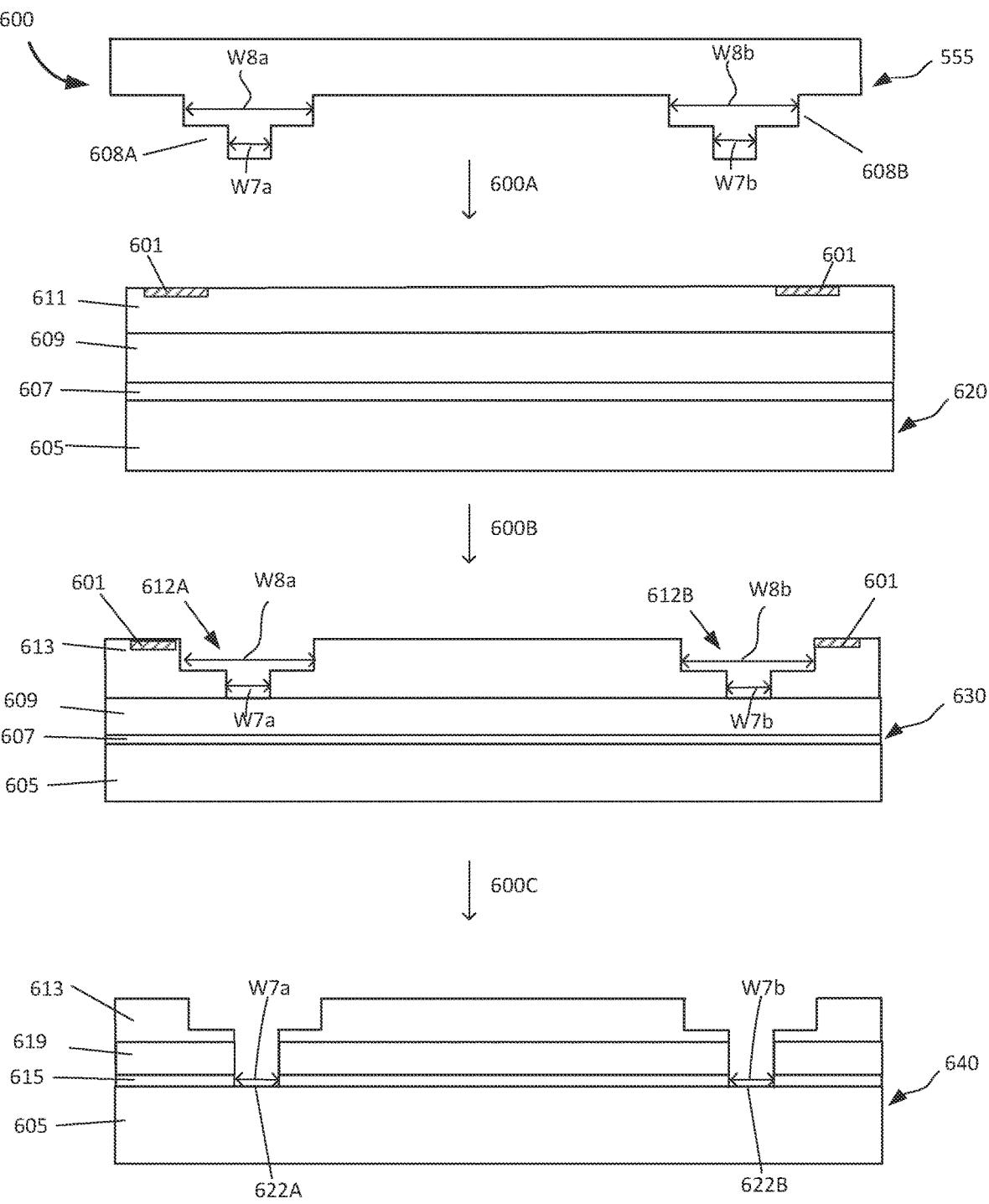
FIG. 6A is a process flow diagram showing multiple cross-sectional views of a method of forming a synthetic nanopore device, according to various aspects of the present disclosure.
Figure 6B:
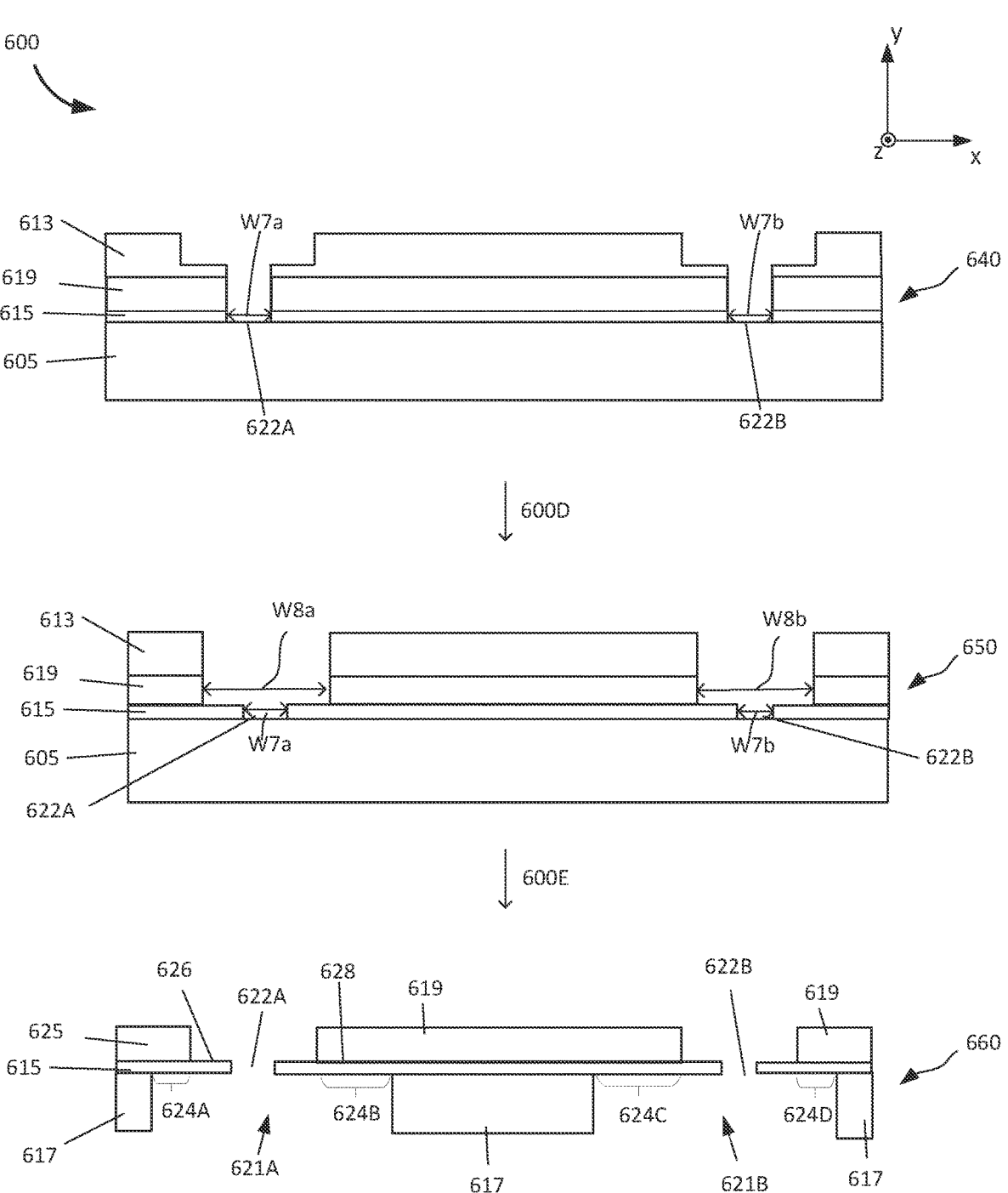
FIG. 6B is a process flow diagram showing multiple cross-sectional views of a method of forming a synthetic nanopore device, according to various aspects of the present disclosure.

FIG. 6 is a process flow diagram showing multiple cross-sectional views of a method of forming a synthetic nanopore device, according to various aspects of the present disclosure. The method includes process flow 600 and provides nanoimprint lithography template 555. Nanoimprint lithography template 555 includes nanoimprint features 608A and 608B (collectively, nanoimprint features 608). Nanoimprint features 608A and 608B with widths W7 and W8, may be reproduced onto structure 620. In other words, each of nanoimprint features 608 has particular dimensions that correspond to the dimensions of a feature to be reproduced onto structure 620.

Structure 620 is formed in step 600A. Structure 620 is an example substrate 605 with nanoimprint membrane 607, mechanical support layer 609 and resist layer 611. Alignment marks 601 may be provided in resist layer 611. Substrate 605 may, for example, be a glass disc, an aluminum disc, an AlTiC disc, or a silicon wafer, among others. Substrate 605 may have any number and type of layers already deposited thereon. Substrate 605 may have been patterned with any different lithographic or patterning process. In the example of structure 620, nanoimprint membrane 607 is deposited on top of substrate 605. Nanoimprint membrane 607 may be formed from a thin layer of SiN, SiC, C or SiO$_2$ in the thickness range of about 1 nm to about 10 nm. Mechanical support layer 609 is deposited on top of nanoimprint membrane 607. Mechanical support layer 609 is generally rigid and may comprise an oxide (e.g., SiO2), a metal, C, or a dielectric material. Mechanical support layer 609 thickness ranges from about 2 nm to about 50 nm. Resist layer 611 is deposited on top of mechanical support layer 609.

In step 600A, nanoimprint lithography template 555 may be aligned with structure 620 via alignment marks 601 and lowered toward structure 620 (e.g., in the negative y-direction).

Structure 630 is formed in step 600B by bringing nanoimprint lithography template 610 into close proximity to substrate 605 with resist layer 611, mechanical support layer 609 and nanoimprint membrane 607. Nanoimprint lithography template 555 is brought into close proximity to substrate 605 without actually touching substrate 605 or nanoimprint membrane 607. Resist layer 611 may conform with the topographic pattern and nanoimprint features 608 upon contact with nanoimprint lithography template 555, thereby forming patterned imprint resist layer 613. Various curing methods may be deployed in order to solidify resist layer 611 into the shape of nanoimprint lithography template 555.

Structure 630 illustrates substrate 605, nanoimprint membrane 607, mechanical support layer 609 and imprinted features 612A and 612B (collectively, imprinted features 612) in patterned imprint resist layer 613. Imprinted features 612A and 612B may have widths W7a, W7b and W8a and W8b. Additional processing steps may now be performed to create the desired synthetic nanopore devices.

In step 600C, structure 630 is exposed to a first etch process to form structure 640. During first etch process step 600C, in regions of imprinted features 612, portions of mechanical support layer 609 and nanoimprint membrane 607 may be removed. Following first etch process step 600C, structure 640 illustrates etched mechanical support layer 619 and etched nanoimprint membrane 615. Etched nanoimprint membrane 615 includes nanopores 622A and 622B (collectively, nanopores 622). Widths W7a and W7b of nanopores 622 are substantially equal to widths W7 of nanoimprint features 618 of nanoimprint lithography template 610.

Second etch process step 600D leads to further removal of portions of etched mechanical support layer 619 and removal of a portion of thickness of patterned imprint resist layer 613 as illustrated in structure 650. Nanopores 622A and 622B have widths W7*a* and W7*b* which are substantially equal to widths W7*a* and W7*b* of imprinted features 612A and 612B. In the example of structure 650, etched mechanical support layer 619 may include openings with widths W8 substantially equal to widths W8 of nanoimprint features 608.

First etch process step 600C and second etch process step 600D may be either reactive ion etching (RIE), plasma etching or inductively coupled plasma (ICP) etching. In one example, first etch process step 600C and second etch process step 600D are RIE processes using fluorinated chemistry, such as CHF6, CHF3 or CF4. In some examples, a directional etch may be used to minimize enlarging of the nanopore diameter (e.g., nanopores 622). In other examples, a directional etch may be combined with a selective etch to minimize imprint resist layer etching.

In step 600E, remaining patterned imprint resist layer 613 is removed. Also, in step 600E, etched substrate 617 is formed by performing a backside selective etch of substrate 605 to generate cavities 621A and 621B in structure 660. Structure 660 includes nanopores 622A and 622B.

Structure 660 illustrates a structure with two nanopores, 622A and 622B and two cavities 621A and 621B.

Structure 660 also illustrates self-aligned mechanical support layer 625. Regions 624A, 624B, 624C and 624D (collectively, regions 624) illustrate regions of overlap between a top surface 626 of etched nanoimprint membrane 615 and a bottom surface 628 of self-aligned mechanical support layer 625. Self-aligned mechanical support layer 625 provides structural support for etched nanoimprint membrane 615 following backside etch of substrate 605.

While structure 660 is illustrative of a structure with two nanopores, 622A and 622B and two cavities 621A and 621B, process flow 600 may be extended over a larger area (e.g., extending in the x-z plane in FIG. 6) to produce an array of mechanically supported nanopores with any number of nanopores and cavities.

Figure 7:
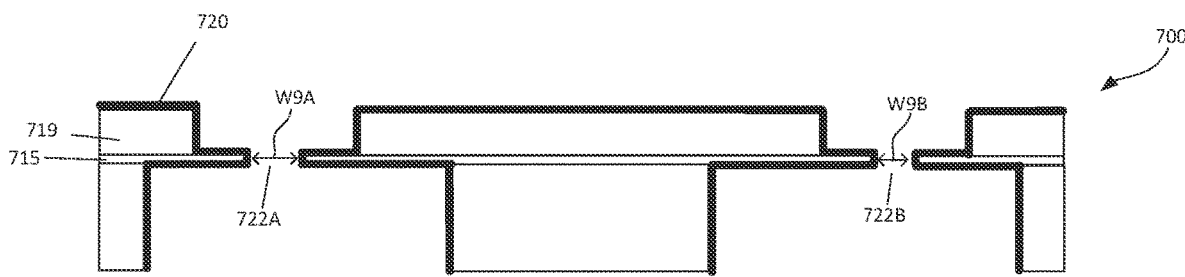
FIG. 7 is a cross-sectional view of a synthetic nanopore device, according to various aspects of the present disclosure.

FIG. 7 is a cross-sectional view of a synthetic nanopore device, according to various aspects of the present disclosure. In some examples, an atomic layer thickness of insulating material may be deposited on top of an array of mechanically supported nanopores. FIG. 7 illustrates structure 700 which includes mechanically supported nanopores 722A and 722B (collectively, mechanically supported nanopores 722) and a thin (<1 nm) layer of insulating material 720. Examples of insulating materials may include a nitride material or an oxide material (e.g., $Si_3N_4$, $Al_2O_3$ or $SiO_2$). Insulating material 720 may be deposited by a conformal deposition process. Examples of conformal deposition processes include atomic layer deposition (ALD) or plasma enhanced chemical vapor deposition (PECVD) among others.

In the example of FIG. 7, mechanically supported nanopores 722 have widths W9A and W9B (collectively, widths W9). Widths W9 may generally be narrower than widths W7 (e.g., widths W7 of structure 650). A potential benefit of depositing insulating material 720 on top of mechanically supported nanopores 722 is, for example, the ability to control nanopore width (e.g., widths W9 of FIG. 7). An increase in the thickness of insulating material 720 would lead to a reduction in dimensions W9 of mechanically supported nanopores 722. Conversely, a decrease in the thickness of insulating material 720 would lead to an increase in dimensions W9 of mechanically supported nanopores 722.

Various examples have been presented for the purpose of illustration and description. These and other examples are within the scope of the following claims.

What is claimed is:

1. A method of manufacturing a synthetic nanopore device for DNA sequencing, the method comprising the steps of:

providing a base template;

forming a guiding layer on top of the base template, wherein the guiding layer is patterned to guide self-assembly;

forming a photoresist layer on top of the guiding layer;

patterning the photoresist layer and etching the guiding layer to form a guiding pattern;

removing the photoresist layer to form a guiding template;

depositing a self-assembled monolayer on at least a portion of the guiding template to form a patterned template wherein the patterned template is configured to act as a masking structure;

exposing the patterned template to one or more etch processes to form a nanoimprint lithography template; and imprinting a membrane with the nanoimprint lithography template to form an array of nanopores in the membrane.

2. The method of claim 1, further comprising photoresist layer patterning using at least one of deep ultraviolet (DUV) lithography, immersion lithography, e-beam lithography and nanoimprint lithography (NIL).

3. The method of claim 1, wherein the base template comprises quartz or silicon.

4. The method of claim 1, wherein the guiding layer comprises metal nitride, metal oxide, metal alloy, or amorphous carbon (a-C).

5. The method of claim 1, wherein the self-assembled monolayer comprises gold nanoparticles.

6. The method of claim 1, wherein the self-assembled monolayer comprises block copolymers.

7. The method of claim 1, wherein the etch process is a reactive ion etch (RIE).

8. The method of claim 1, wherein the etch process is a directional etch.

9. The method of claim 1, wherein the etch process is an isotropic etch.

10. The method of claim 1, wherein a size of a nanopore is less than 5 nm.

11. The method of claim 1, wherein the self-assembled monolayer is removed prior to imprinting the membrane.

12. A method of manufacturing a synthetic nanopore device for DNA sequencing, the method comprising the steps of:

providing a base template;

forming a guiding layer on top of the base template, wherein the guiding layer is patterned to guide self-assembly;

forming a photoresist layer on top of the guiding layer;

patterning the photoresist layer and etching the guiding layer to form a guiding pattern;

removing the photoresist layer and etching the base template to form a guiding template;

depositing a self-assembled monolayer on at least a portion of the guiding template to form a patterned template, exposing the patterned template to at least one etch process to form a nanoimprint lithography template, wherein the nanoimprint lithography template comprises one or more levels;

providing a substrate wherein the substrate comprises a mechanical support layer and a membrane; and imprinting the membrane with the nanoimprint lithography template to form an array of mechanically supported nanopores in the membrane.

13. The method of claim 12, wherein the mechanical support layer is self-aligned to the nanopores.

14. The method of claim 12, wherein the etch process is a reactive ion etch.

15. The method of claim 12, wherein the etch process is a directional etch.

16. The method of claim 12, wherein the etch process is a selective etch.

17. The method of claim 12, wherein an atomic layer thickness of an insulating material is deposited on the array of mechanically supported nanopores.

18. The method of claim 17, wherein the insulating material comprises alumina.

19. The method of claim 17, wherein the insulating material comprises an oxide.

20. The method of claim 17, wherein the insulating material comprises a nitride.

* * * * *